United States Patent
Rayssac et al.

(10) Patent No.: US 6,821,376 B1
(45) Date of Patent: Nov. 23, 2004

(54) METHOD FOR SEPARATING TWO ELEMENTS AND A DEVICE THEREFOR

(75) Inventors: Olivier Rayssac, Grenoble (FR); Hubert Moriceau, St Egrève (FR); Bernard Aspar, Rives (FR); Philippe Montmayeul, Bernin (FR)

(73) Assignee: Commissariat a l'Energie Atomique, Paris (FR)

( * ) Notice: Subject to any disclaimer, the term of this patent is extended or adjusted under 35 U.S.C. 154(b) by 49 days.

(21) Appl. No.: 10/030,272

(22) PCT Filed: Jul. 12, 2000

(86) PCT No.: PCT/FR00/02014
§ 371 (c)(1),
(2), (4) Date: Jan. 8, 2002

(87) PCT Pub. No.: WO01/04933
PCT Pub. Date: Jan. 18, 2001

(30) Foreign Application Priority Data

Jul. 12, 1999 (FR) .............................. 99 09007

(51) Int. Cl.[7] .............................................. B32B 35/00
(52) U.S. Cl. ................. 156/344; 156/382; 156/584; 438/458; 29/426.5; 29/239
(58) Field of Search ................. 156/344, 584, 156/382; 438/455, 458; 29/426.1, 426.2, 426.4, 426.5, 239

(56) References Cited

U.S. PATENT DOCUMENTS

| | | | | |
|---|---|---|---|---|
| 3,190,785 | A | * 6/1965 | Comet ......................... | 156/584 |
| 3,547,744 | A | * 12/1970 | Buchaklian, Jr. ........... | 156/584 |
| 3,918,150 | A | 11/1975 | Gantley | |
| 4,071,944 | A | * 2/1978 | Chuss et al. .................. | 438/17 |
| 4,255,216 | A | * 3/1981 | Conant et al. ................ | 156/80 |
| 4,466,852 | A | * 8/1984 | Beltz et al. ................. | 156/344 |
| 5,029,418 | A | 7/1991 | Bull | |
| 5,553,374 | A | * 9/1996 | Hanks et al. ................. | 29/762 |
| 5,863,375 | A | 1/1999 | Cha et al. | |
| 5,897,743 | A | * 4/1999 | Fujimoto et al. ........... | 156/584 |
| 5,985,742 | A | * 11/1999 | Henley et al. .............. | 438/515 |
| 6,140,209 | A | * 10/2000 | Iwane et al. ................ | 438/458 |
| 6,418,999 | B1 | * 7/2002 | Yanagita et al. ............ | 156/584 |
| 6,513,564 | B2 | * 2/2003 | Bryan et al. ................ | 156/584 |
| 2003/0157783 | A1 | * 8/2003 | Fonash et al. .............. | 438/458 |
| 2003/0173033 | A1 | * 9/2003 | Lee et al. .................... | 156/382 |

FOREIGN PATENT DOCUMENTS

| | | |
|---|---|---|
| EP | 0 703 609 | 3/1996 |
| EP | 0 925 888 | 6/1999 |
| FR | 2 752 332 | 2/1998 |
| JP | 62-230537 | 10/1987 |
| WO | WO 98/52216 | 11/1998 |

OTHER PUBLICATIONS

W. P. Maszara, et al., J. Appl. Phys, vol. 64, No. 10, pps. 4943–4950, "Bonding of Silicon Wafers for Silicon–On–Insulator", Nov. 15, 1988.
C. Maleville, et al., Electrochemical Society Proceedings, vol. 97–36, pps. 46–55.
O. Rayssac, et al., 2nd International Conference on Materials for Micro–Electronics, pps. 183–191, "Influence of Surface Characteristics on Direct Wafer Bonding", Sep. 14/15, 1998.

* cited by examiner

Primary Examiner—Mark A. Osele
(74) Attorney, Agent, or Firm—Oblon, Spivak, McClelland, Maier & Neustadt, P.C.

(57) ABSTRACT

A process and device for separating two semi-conductor substrate wafers along an interface. The process includes forming a cavity, and initiating separation by applying force to the interface through the cavity. The device utilizes fluid or gas, and pressure chambers, to subject adherent faces of the interface to at least one of chemical or mechanical action.

42 Claims, 8 Drawing Sheets

METHOD FOR SEPARATING TWO ELEMENTS AND A DEVICE THEREFOR

TECHNICAL FIELD

The present invention relates to a process for separating two elements adhering one to the other by means of adherent faces, with this separation being able to be obtained under the action of a fluid and/or a mechanical element allowing the separation to be initiated locally. It also relates to a device for implementation of this process.

The invention applies in particular to the field of microelectronics in order to separate two plates adhering one to the other. It is of particular interest in handling thin, fragile and very flexible plates.

STATE OF PRIOR TECHNIQUE

Document FR-A-2 752 332 discloses a process for separation of a support plate by the insertion, at the bonding interface, of a quite flexible separator element so as not to scratch the surfaces. This separator element consists of several parts allowing minimum optical sighting, during the operation to open the interface, to be compatible with an industrial goal. This process was developed for plates bonded by means of attractive forces.

The article entitled "Bonding of silicon wafers for silicon-on-insulator" by W. P. MASZARA et al., published in the review J. Appl. Phys. 64 (10), 15 Nov. 1988, pages 4943–4950, relates to the measurement of bonding energy by the method of the blade inserted at the interface of two elements adhering one to the other. For a given bonding energy, the thicker the blade, the further the opening wave propagates from the opening point at the bonding interface. Similarly, the greater the bonding energy, the less the separation wave propagates for a given blade thickness.

To apply a separation process as described in document FR-A-2 752 332, it is advantageous if the surface energy is low and the separator element is thick. A separation wave may thus be propagated over a significant length compared to the diameter of the plates for separation.

However, use of a thick separator element may lead to a fracture of one of the plates due to the curvature radius being too low. In addition, it has been shown that the greater the bonding energy, the more the blade or the separator element must be inserted gently in the interface to prevent the risk of fracture of the plates, relaxation of the opening stresses being made possible through a sufficiently slow opening.

In addition, in the case of a structure with several interfaces, the opening may be propagated from one interface to another, associated, for example, with a lower bonding energy.

It is also known that the bonding energy between two elements increases when a thermal treatment is applied. On this subject one may refer to the article by C. MALEVILLE et al., published in the review Electrochemical Society Proceedings Volume 97–36, pages 46–55. As an a example, silicon plates the surfaces of which have been made hydrophilic are bonded to one another. A bonding energy greater than $1 \text{ J/m}^2$ is obtained for bondings followed by thermal treatment at 1000° C. Thus, for silicon plates 525 µm thick (typical thickness of plates of 100 mm diameter), a blade 600 µm thick succeeds in causing an opening of the bonding interface over a length of around 3 cm or less. This length of opening is insufficient to separate the plates. It is then necessary to introduce a thicker separator to propagate this opening. This causes a reduction of the flexibility of the separator elements and involves the risks mentioned above.

Inserting a blade is not the only method enabling two elements bonded to one another to constitute a structure to be separated. Document WO 98/52 216 describes a process for controlled cleavage of a substrate through the introduction of particles, originating, for example, from a steam source, from a side of the structure where the interface ends. However, this technique can be used only to separate stacks in which a zone has previously been embrittled, for example by ion implantation. The separation interface can then only be the embrittled zone. U.S. Pat. No. 5,863,375 discloses the separation of two plates bonded to one another to constitute a structure. Separation is obtained under the effect of a jet of liquid directed on the plane of the interface to a face of the structure where the interface ends.

Moreover, the faces of the plates for separation may have received, before being bonded, one or more deposits of thin films. In this case it is not possible to use the teaching of U.S. Pat. No. 5,863,375. The separation liquid jet also acts on deposited films.

As there is no precise location of the bonding interface, the separation may occur in one of the deposited layers if the adherence energy of a film to its plate is less than the adherence energy of the bonding interface between the two plates. This technique is also very expense in terms of the consumption of fluid used, since a large quantity of this fluid does not act on the bonding interface.

These known techniques for separation using a jet of particles or a jet of liquid replacing a separating blade reveal other problems. A first problem relates to the precise location of the opening interface. Other problems are related to the fact that to apply the opening techniques easily the bonding interface must not be too resistant taking account of the various thermal treatments which can be applied.

Traditionally, the bonding energy may be controlled by preparing the surfaces to modify their hydrophilic character or their roughness. On this subject, one may refer, for example, to the document "influence of surface characteristics on direct wafer bonding" by O. Rayssac and coll., $2^{nd}$ international conference on materials for micro-electronics, 14/15 Sep. 1998, ION Communications Ltd.

Document EP-A-0 703 609 discloses a process for transferring a thin semiconducting layer from a support substrate to a target substrate, taking advantage of the fact that the bonding energy between the layer and the support substrate is less than the bonding energy between the layer and the target substrate. When a pulling and/or shearing and/or torsion force is applied to the structure, the separation occurs between the layer and the support substrate, thus causing the layer to be transferred.

This process must, as above, take account of the possible problem of resistance of the bonding interface.

In addition, the thin layer is bonded to the support substrate in order to undergo a number of processes including, for example, one or more deposits of thin films the adherence energy of which may prove to be lower than the bonding energy of the substrates to each other. In particular, methods of separation based on traction, shearing or torsion, applied globally to the substrates, may not be used.

ACCOUNT OF THE INVENTION

The invention has been designed to remedy the disadvantages reported above.

To this end, the invention relates more specifically to a process for separating two elements of a structure containing both elements put in adherent contact with one another by respective adherent faces and with at least one interface.

Before adherent contact is accomplished, the process involves at least one cavity being made. The cavity is made in at least one of the elements, ending respectively at the interface, to allow separators to pass into the cavity. The process also comprises, during separation, the exercise of a force, in a localised manner in the interface, through the application of the said separators to initiate the separation of the two elements from the interface and to continue it, if applicable, until complete separation of the two elements.

The separators may include, among other things, means exerting a mechanical action and/or fluid pressure and/or exerting a chemical action on at least one of the adherent faces at the interface.

Thus, the force applied to the interface must be understood as resulting from a mechanical and/or fluid pressure and/or chemical action.

The cavities may be obtained by engraving. They may be made on the periphery or in a more central region of the elements. In particular they may be distributed across all or part of an interface of adherence between the elements, so as to control propagation of the separation opening. The cavities may also extend as far as an interface separate from that formed by the elements' adherence faces, inside one of the elements.

If several interfaces are used for the separators, the cavities may be arranged so as to initiate the separation at a given location of the interfaces.

When the separators include means exerting a fluid pressure in the interface zone, and when this fluid is liquid, these separators may include microwaves or impulse excitation of the liquid fluid.

The two elements may be put into adherence with one another with an adherence energy which varies according to the various regions of the adherence interface so as to initiate the separation at a given location of the interface.

In addition, the separators may be such that the separation of the two elements in the interface occurs at one or more locations in a simultaneous or sequential manner.

The invention also relates to a device for separating two elements of a structure, adhering to one another by adherence faces at least one of which has cavities in an interface zone, so as to be able to subject at least one of the adherence faces to the influence of a fluid and possibly to a mechanical action, with the device comprising an enclosure with at least a first chamber called a high-pressure chamber able to receive the fluid, and a second chamber, called a low-pressure chamber, the enclosure being formed so as to receive both the adherent elements of the structure such that the cavities communicate with the high pressure chamber.

This device may also include means forming a stop to a deformation considered excessive of one and/or the other element of the structure on their separation.

The enclosure may, preferably, be fitted with at least one joint arranged between an element of the structure and the wall of the enclosure to separate the high-pressure chamber from the low-pressure chamber.

The invention also relates to a handle for transferring objects such as, for example, electronic chips. The handle has an adherence face with cavities in at least one interface zone, to which objects may adhere, and the handle also has means of access to the interface zones to separate objects from them. The objects are of various dimensions, from a few microns to several tens of centimetres for example.

The means of access are, for example, channels or any other type of depression or perforation made in the adherence face.

The handle may contain a plate one face of which constitutes the adherence face, with the plate being pierced with penetrating holes ending in the interface zones and constituting the said means of access to the interface zones. The penetrating holes may be holes allowing a tool for separating objects to be passed through.

The means of access to the interface zones preferably allow a fluid pressure to be applied to the objects.

A fourth goal of the invention relates to a process for localised transfer of objects made on the surface of a first substrate, with an adherence face, where the process comprises the following stages (in this order or in another order):

putting the adherence face of one or more object in adherent contact with the adherence face of a transfer handle as described above.

possibly, thinning of the first substrate from the free face of this first substrate, placing into adherent contact of at least one of the said objects with a receiving substrate, and separation of the said object from the handle using the means of access to the interface zone, The process may be completed by the separation of the transfer handle, which may contain objects which are not yet transferred, and of the receiving substrate which contains the transferred objects.

If the objects are not separated from one another, i.e. clipped before the placing into adherent contact with the receiving substrate, the process may also include a stage of clipping of objects so as to allow their individual transfer.

BRIEF DESCRIPTION OF THE DRAWINGS

The invention will be better understood and other advantages and features will appear on reading the following description, given as a non-limiting example, accompanied by the annexed drawings, among which.

DETAILED DESCRIPTION OF EMBODIMENTS OF THE INVENTION

The invention allows the separation of two elements the adherence surfaces of which may be bonded by means such as, for example, glues (polymers, epoxy, etc.) or bonded by molecular adherence. The invention applies particularly well to the case in which these elements are plates and notably if one of these plates is a semi-conductive plate the two principal faces of which may receive a treatment using micro-electronics techniques.

The idea consists in introducing a means, notably a fluid and/or a mechanical tool, around the bonding interface so as to cause an action allowing all or part of the elements to be separated, offering the choice of being able to locate the interface zone for separation in the first place. A fluid may, for example, be introduced at the interface, using an engraving undertaken prior to the bonding in one of the elements or in both. Tests have shown that an engraving of this kind may be undertaken without hindering the bonding. To allow the introduction of a fluid, this engraving must communicate with the outside. It may be communicating at the periphery or through one of the elements. The separation may thus be initiated in the vicinity of the engraved zone.

The engraving may be undertake to constitute, for example, a network of blocks, a network of cavities, whether or not penetrating, or take a spiral shape or a ring shape or a shape in sectors. These various possibilities are illustrated by FIGS. 6 to 12 described below.

The fluid may be introduced using an adapter in the cavity made by engraving, or by placing the structure formed from the two bonded elements in an enclosure filled with fluid the pressure of which is controlled.

Figure 1A:
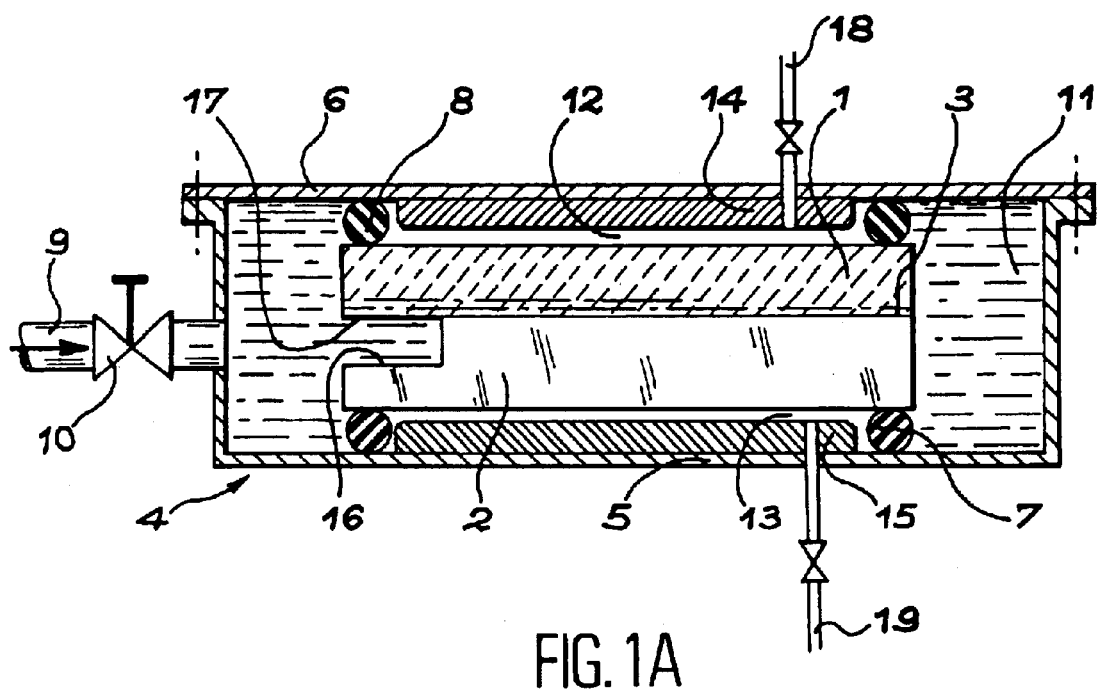
FIG. 1A represents, as a transverse section, a first possibility for embodiment of a device according to the invention intended for separating two elements adhering to one another.

FIG. 1A shows in section a first possibility of embodiment of a device according to the invention allowing the separation of two elements. In the example of the figure, the elements are two circular plates 1 and 2 bonded to one another with an interface 3. The device contains a sealed enclosure 4 of cylindrical shape with a lower wall 5 and an upper wall 6. Joints, for example toric joints, 7 and 8, are fixed respectively to the lower wall 5 and upper wall 6 and support the main faces of the plates the device is dimensioned according to the size of plates 1 and 2 which are to be separated. The device is connected laterally to a duct 9 for conveying fluid, on to which is mounted a valve 10.

When the structure consisting of plates 1 and 2 bonded to each other is installed in the device, enclosure 4 is divided into several chambers: a chamber 11 called the high-pressure chamber, for receiving the fluid conveyed by duct 9, and two chambers 12 and 13 located respectively above and below the structure for separation, and called low-pressure chambers.

The pressure which the fluid must exert to cause the separation depends on the adherence energy between the plates. In the case of a molecular adherence, the latter is determined in particular by preparing the surfaces before bonding and also by the thermal treatment(s) undergone by the structure. To remain within the limit of elastic deformation and not to deform the plates irremediably, it is possible to alter the distance between the bonded structure and the inner surface of the enclosure located opposite the plates. Stops 14 and 15 fixed on the inner surface of the enclosure allow the deformations caused in the plates to be limited, and may, favour separation. The initial distance between the stop and the corresponding plate depends notably on the thickness of the plate and its nature.

FIG. 1A shows that plate 2 contains a peripheral engraving 16 allowing the fluid to reach an interface zone 17.

References 18 and 19 designate ducts respectively in communication with the low-pressure chambers 12 and 13, which can be designed to control the pressure of a fluid located in these chambers. Ducts 18 and 19 can be simple vents, able to be put in communication, for example with the atmospheric pressure. They can also be linked to means for adjusting the pressure of a fluid, for example a gas located in the low-pressure chambers, so as to control the separation precisely. The pressure of the fluid in the low-pressure chambers is, however, maintained at a lower value than the pressure of the fluid applied to the high-pressure chamber, to allow separation.

Figure 1B:
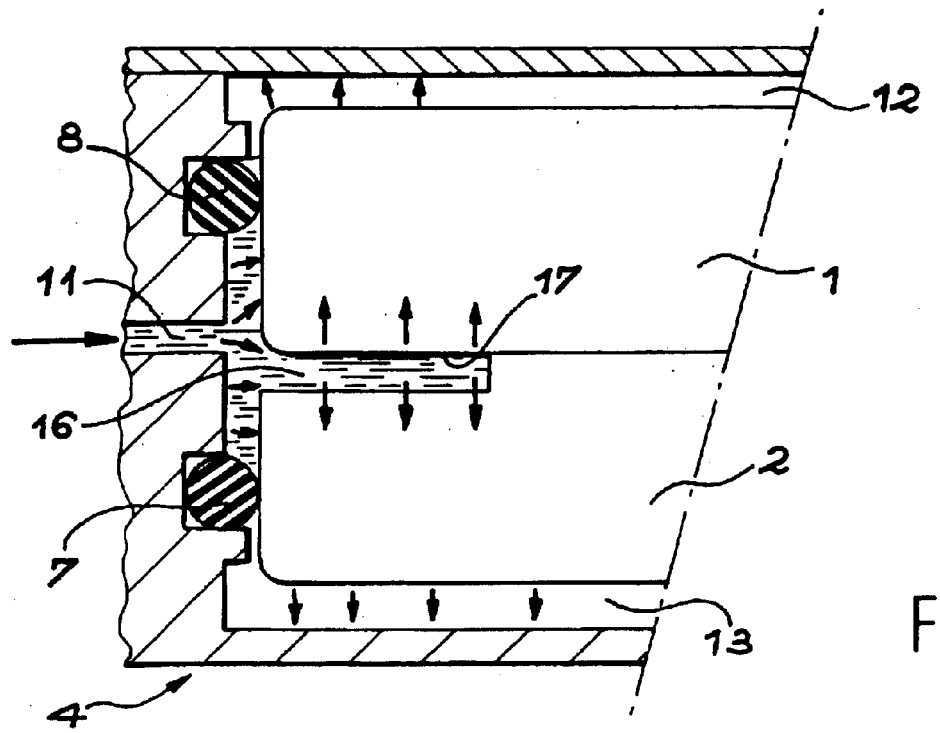
FIGS. 1B and 1C are partial schematic sections illustrating possible variants for embodiment of the device of FIG. A1.

FIG. 1B shows, in a partial manner, and on a larger scale, another possible embodiment of the separation device constituting a variant compared to FIG. 1A. The identical parts, similar or corresponding to that of FIG. 1, are identified with the same numerical references and their account is not given here.

It is observed in FIG. 1B that joints, for example toric joints, 7 and 8 are not fixed on the upper and lower walls of the device but on the lateral walls which are facing the plate's edges.

Joints 7 and 8 rest respectively on the edges of the plates at a sufficient distance from the bonding interface so as not to hinder access of the pressurised fluid to the peripheral engraving 16 and thus to the interface zone 17.

The action of the fluid on the adherence faces in the interface zone is indicated by arrows. Arrows also indicate the separation of the plates pushed back towards the low-pressure chambers 12 and 13.

Figure 1C:
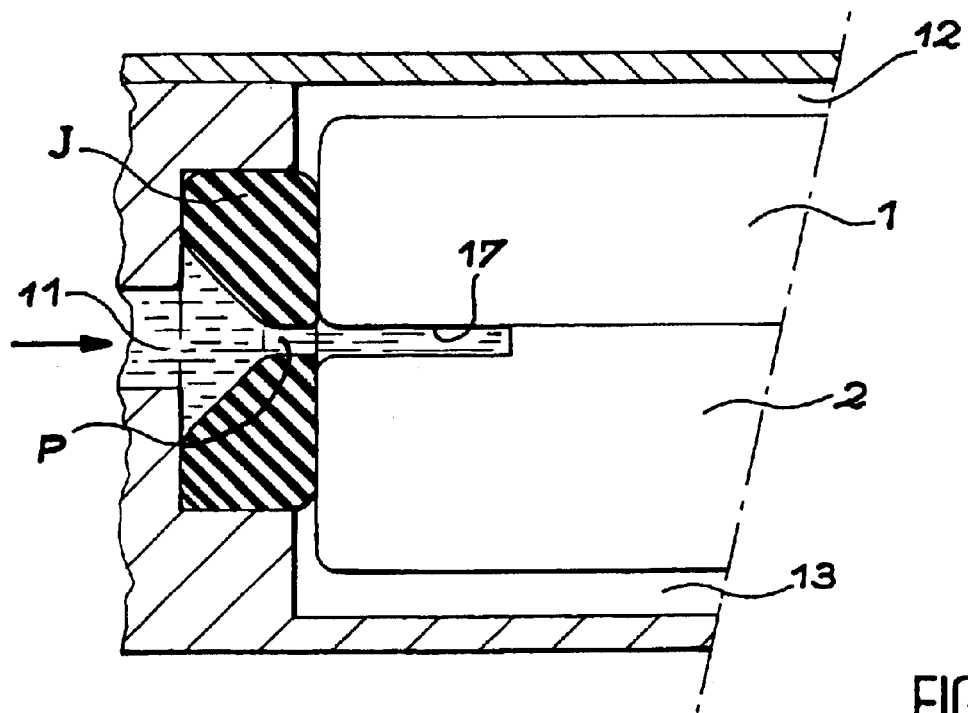

FIG. 1C also shows, in a partial manner and on a larger scale, yet another possible embodiment of the separation device, constituting a variant in relation to FIGS. 1A and 1B. The parts identical or similar to those of the previous figures are always indicated with the same references.

It is observed in FIG. 1C that the toric joints have been eliminated and replaced by a lip joint J. Joint provides sealing between the lateral wall of the device and the first and second plates. It also provides sealing between the high-pressure chamber 11 and the low-pressure chambers 12 and 13.

A passage P made in joint J allows the pressurised fluid to reach the interface zone 17 of plates 1 and 2.

Figure 2:
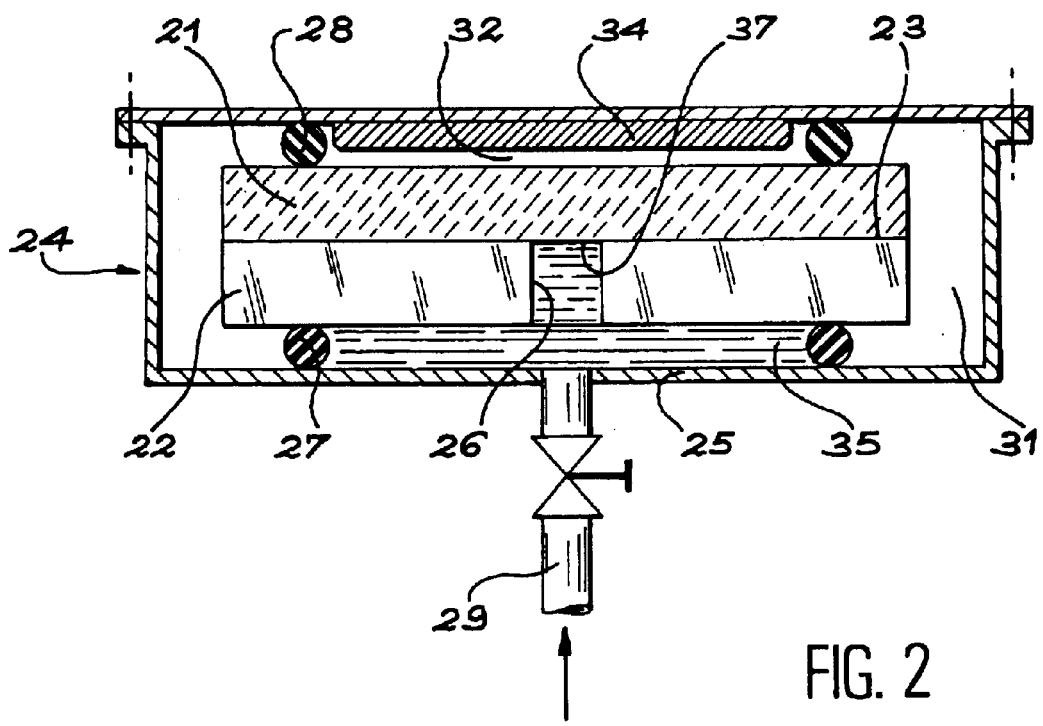
FIG. 2 represents, seen as a transverse section, a second possible embodiment of a device according to the invention intended for separating two elements adhering to one another.

FIG. 2 shows yet another possible embodiment of a device according to the invention allowing the separation of two circular plates 21 and 22 bonded one to another with an interface 23. A duct 29 conveying fluid is connected differently from that of FIG. 1A. It leads to the centre of the lower wall 25 of enclosure 24. This device divides enclosure 24 into a high-pressure chamber 35 and into two low-pressure chambers: chamber 31 and chamber 32 and in which plate 21 may be deformed.

FIG. 2 shows that plate 22 has a central penetrating hole 26 allowing the fluid to reach an interface zone 37. The central hole may be replaced and/or completed by other holes penetrating the plate (with identical or different diameters).

Figure 3A:
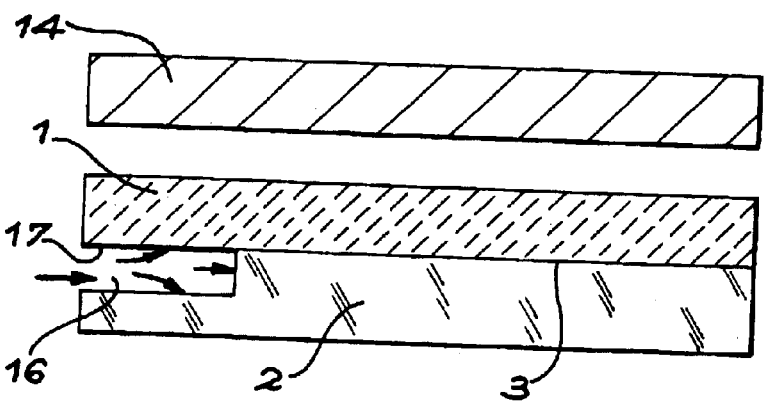
FIGS. 3A to 3C illustrate the conduct of the process of separating two elements adhering to one another, according to the invention.
Figure 3B:
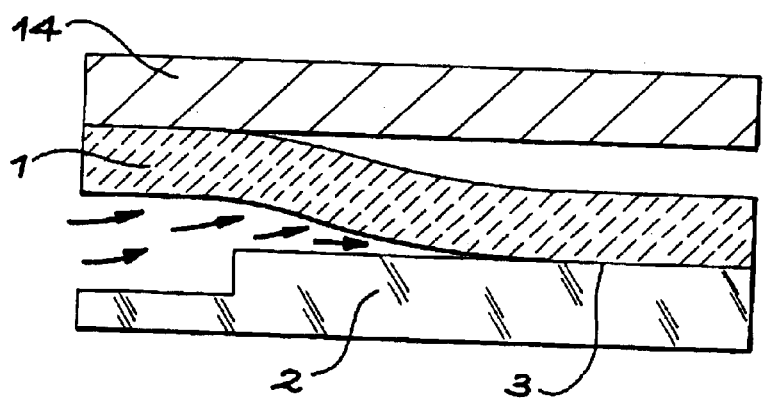
Figure 3C:
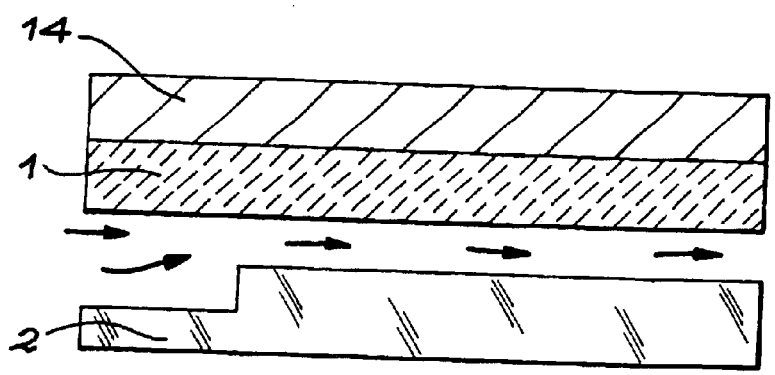

FIGS. 3A to 3C illustrate an example of the conduct of the process of separation of plates 1 and 2 in FIG. 1. At the start of the operation, the fluid is introduced and starts to exert its action on the walls of cavity 16 and the interface zone 17 as is shown by the arrows in FIG. 3A. FIG. 3B shows an example of the commencement of the separation between plates 1 and 2 under the action of the fluid pressure and the role of stops 14 and 15. Plate 1 in this example is deformed more than plate 2. This example occurs in the case where one fie, plate is finer than the other. Thus, in the case of power electronic applications, it is possible, thanks to the invention, to produce and manipulate membranes of several tens of micrometers. FIG. 3C shows plates 1 and 2 totally separated.

In the cases represented in FIGS. 1 and 2, plates 1 and 21 are, for example, elements or membranes in which circuits can be produced whereas plates 2 and 22 are elements reserved for the separation operation. Plates 2 and 22 can be designated under the name transfer handles. These handles are easy to re-use.

The advantage of locating the engraving in the plate used as a handle is that, in addition to localising the separation of the structure horizontally, this allows the interface to be localised vertically in the structure. As indicated above in the state of prior technique, if layers have been deposited before the plates are bonded (see the layers shown in dot-and-dash lines in FIG. 1) and if these layers have lower adherence than the bonding interface, only this vertical location will allow separation at the bonding interface.

To increase the fluid's effectiveness, it may be advantageous if, in addition to the pressure action, this fluid is able to exert a chemical action in the interface, thus facilitating separation. For an interface with a silicon oxide base, a solution formed from HF diluted in water may be used to control the speed of engraving. If a face for separation must be preserved (a face treated by micro-electronics techniques, for example), the part to be preserved may be protected by a stop layer (for example, polycrystalline silicon) on which the interface oxide is deposited or formed.

In addition, in the case of a liquid fluid, the separation may be facilitated, for example, through the use of an excitation of the microwave type, pulse type, etc.

It may be advantageous to prepare one of the adherence faces of at least one of the plates, partly or wholly, in order that the resulting bonding energy varies in the plane of the bonding interface. It is possible, for example, to define a central zone of the interface where the adherence will be stronger than in the periphery. This energy difference will be exploited to induce the subsequent separation by localising the commencement of separation in the periphery of the structure. More generally, this technique may be used advantageously to generate localised zones where the bonding energy is different to the bonding energy of the other zones.

FIGS. 4A to 4D illustrate the acquisition of a membrane, for example made from a semi-conductive membrane, the main faces of which are treated using micro-electronics techniques. The goal is to obtain a membrane approximately, for example, 100 μm thick, treated on both faces from a standard 4-inch silicon plate 525 μm thick. This plate will have to be subjected to various operations, for example thermal annealings (typically at 1100° C.), mechanical treatments (polishing, surface treatments), chemical treatments (dry or wet engraving), deposits (oxides or metals), and implantations.

These various operations imply manipulations of the membrane, which is problematic when it is around 100 μm thick or less. The invention enables this problem to be overcome.

Figure 4:
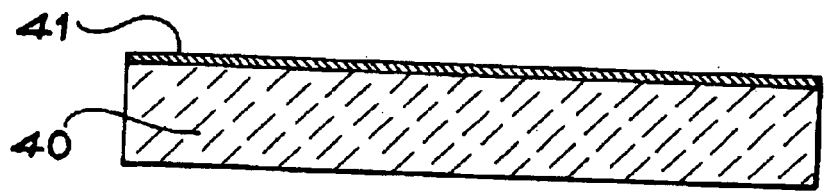
FIGS. 4A to 4D illustrate application of the process according to the invention for obtaining a semi-conductive membrane, the main faces of which receive treatments using micro-electronics techniques.
Figure 4:
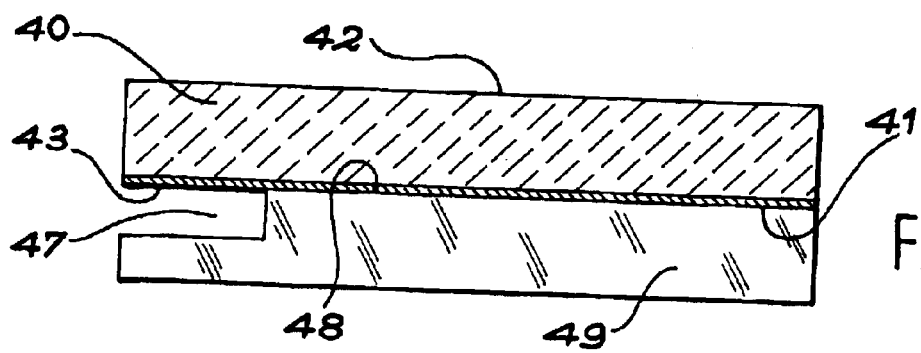
Figure 4:
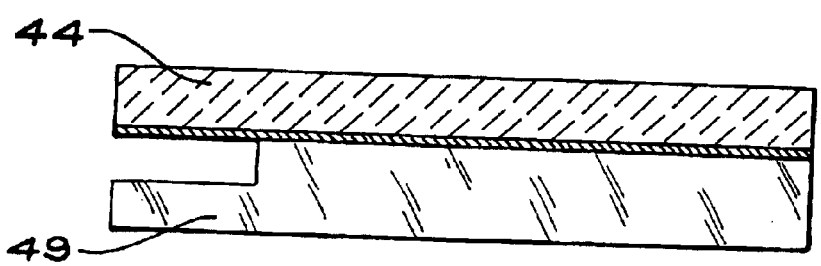
Figure 4:
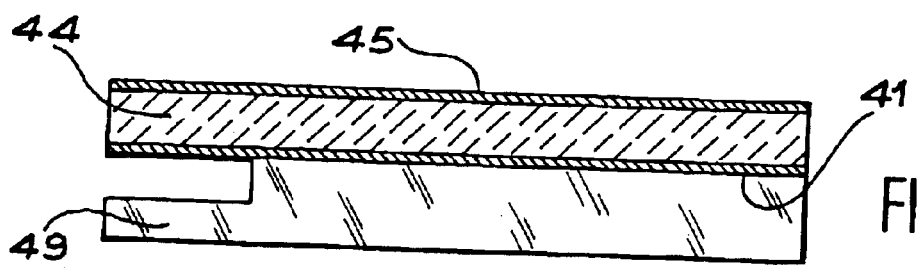

FIG. 4A shows a silicon plate 40 intended to supply a membrane. The plate is represented with one of its main faces, face 41, which has previously undergone treatments using micro-electronic techniques, and which has received, for example, an encapsulating oxide layer. The oxide layer may possibly be polished to give a flat surface.

FIG. 4B shows plate 40 (in a reversed position in relation to FIG. 4A) put in contact by its face 41 with face 48 of a plate 49. Plate 49 is ideally a plate of oxidised silicon. Bonding by $SiO_2/SiO_2$ hydrophilic molecular adherence may thus be obtained. The bonding energy may be controlled by varying the more or less hydrophilic or more or less rough nature of the surfaces. It is then possible to undertake operations using micro-electronic techniques with the other face, face 42, of plate 40, in perfect safety from the mechanical standpoint to obtain finally a membrane treated on both faces.

As indicated above, to obtain the desired molecular adherence, it is possible to modify the hydrophilic nature and/or roughness using traditional techniques. By combining both methods, after annealing at 1100° C., it is possible to obtain a bonding energy of around 500 $mJ/m^2$ for an $SiO_2/SiO_2$ structure the surface roughnesses of which are typically 0.6 nm RMS (root mean square). This value is substantially less than that (2 $J/m^2$) obtained for bonding of plates the surface roughness of which is around 0.2 nm. With this bonding energy value, the process of the invention allows plate 40 to be separated from plate 49 and a fine membrane to be obtained finally which has been subjected to at least one treatment on at least one of its faces, with a minimal risk of deterioration.

As yet another example, this technique may be used advantageously to generate localised zones the bonding energy of which is different from the bonding energy of the remainder of the structure. The variation of the bonding energy, in different zones, may be obtained by a technique using partial masking of at least one of the surfaces in contact in the bonding. For example, it is possible to generate different surface roughnesses in masked and non-masked zones by a chemical attack, a dry engraving, an ion implantation, etc.

The roughness may advantageously be controlled so as to cause the lowest bonding energy in the zone (s) chosen for the commencement of separation.

Plate 49 (see FIG. 4B) has an engraved part 47 forming an example of a cavity of the recess type, giving access to an interface zone 43 on which a fluid pressure may be exerted.

FIG. 4C shows the structure obtained successively by surface treatment and possibly polishing of plate 40 in order to transform this plate into a membrane 44.

Free face 45 of membrane 44 can then be treated by micro-electronic techniques. A membrane treated on both faces is obtained (see FIG. 4D), which will be separated from plate 49 in accordance with the invention.

In conceivable treatments it is possible to make deposits of layers or engravings, or even transfer another structure on to the membrane, notably to rigidify it.

For certain applications, for example in optoelectronics, it appears to be advantageous to be able to associate a chip or optoelectronic component produced, for example, on III–V material with an electronic circuit produced for example on silicon. In this case, to produce an object of this kind, one approach consists in transferring the chip made of III–V material to a whole plate containing the circuits. The transfer to a whole plate allows the implementation of technological stages subsequent to the transfer. As an example, one can mention, among the operations subsequent to the transfer, those allowing contacts to be made between, for example, the chip and the circuit. The invention allows electronic chips to be transferred to whole plates. It has the advantage that it allows chips to be made thinner.

FIGS. 5A to 5F illustrate the transfer of an electronic chip from a first substrate to a receiving substrate.

Figure 5:
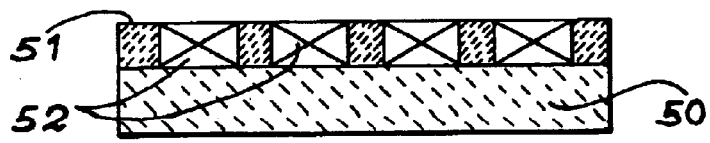
FIGS. 5A to 5F illustrate the transfer of an electronic chip from a first substrate to a receiving substrate using the process according to the present invention.
Figure 5:
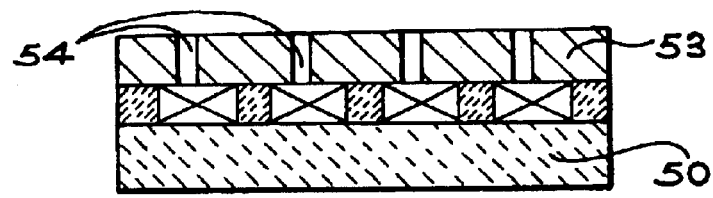
Figure 5:
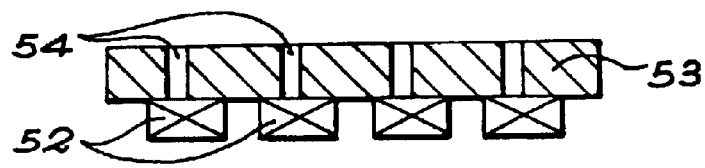
Figure 5:
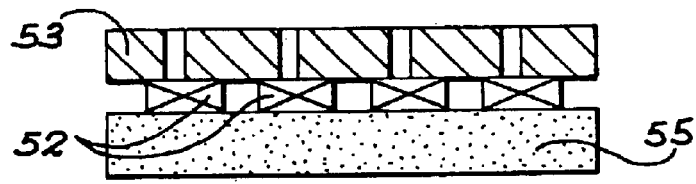
Figure 5:
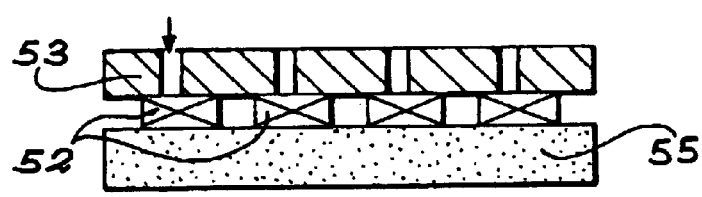
Figure 5:
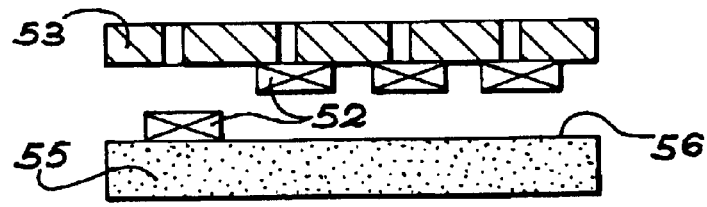

FIG. 5A shows a plate 50 one of the principal faces of which, face 51, has been treated to produce individualised chips 52. The chips may, for example, be electronic or optoelectronic components. The material of plate 50 may be of type III–V or GaAs. The area of the chips may be of around 250 µm×250 µm.

FIG. 5B shows the joining of plate 50, on the chips side, with a handle plate 53. The joining may be achieved through the bringing into contact with two plates with bonding by molecular adherence or using an intermediate layer of glue or resin. The joining is realised with a controlled bonding energy. For example, in the case of molecular bonding, this energy may be chosen by controlling the surface roughness and/or the hydrophilicity and/or percentage of the area in contact.

If it is desired to transfer chips, handle plate 53 is made such that holes 54 penetrate it, allowing communication between the two main faces of the handle 53 bonded to the chips. The size and pitch of the holes are appropriate for the size and pitch of the chips. In this example, the pitch of the chips is around 250 µm. The diameter of the holes must be appropriate for the pitch and separation technique. If a tool is used, for example, of the injector needle type, it exerts a mechanical action. If a separation fluid is used, the dimension of the holes may be very small, less than or equal to the dimension of the chips. If the chips are larger, for example 500 µm×500 µm, the hole dimension may be, for example, 200 µm. Use of an injector needle is then facilitated. Depending on the dimension of the element to be transferred, one or more injector needles may be used. The end of the injector needle may be pointed, flat or conical. The injector needle may also be pierced at the end, for example to convey the fluid. A combination of the fluid and the tool may advantageously be envisaged.

FIG. 5C represents the structure obtained after plate 50 is thinned to the desired thickness and chips 52 separated one from the other. If optoelectronic components are produced on a GaAs layer, they may be around 10 µm thick. The separation of the chips may be accomplished by engraving or more simply using a cutting saw.

The thinned structure is brought into contact with a receiving plate 55 (see FIG. 5D).

As indicated by an arrow in FIG. 5E, a chip 52 for example may be separated from the handle plate 53 by means of a tool and/or transfer fluid.

When the location of chip 52 for transfer has been prepared on face 56 of the receiving plate 55, separating plates 53 and 55 leaves the chip separated from plate 53 on plate 55, whereas the other chips remain on plate 53.

This process is also of interest for the transfer of thin circuits for smart card or "disposable ticket" applications.

The present invention has many advantages. Firstly, it can allow both sides of (for example) a silicon plate to be worked, without any risk of deterioration. It is thus possible to treat a first face of a plate whilst protecting the second face, by adherence to a support. Subsequently, the treated face may itself be protected by adherence to another support while the other face, after separation, is treated in its turn. This invention can also facilitate use of fine plates, also called membranes (less than 300 µm thick for a diameter of 100 mm). This type of plate is, for example, found increasingly often in micro-electronics applications, and also, for example, in power electronics. The advantage of this type of plate is that it is possible to produce structures made from it while limiting, due to their thinness, problems of thermal heating or leakage current when in use. Conversely, these plates are places where high stresses occur during use, due to the thermal treatments they undergo and their thinness. It is, for example, very risky to put this type of plate in ovens since they tend to deform and even in extreme cases to break as a consequence of the process temperature and stresses generated by the thermal treatments. In addition, these plates are not always compatible with equipment used in micro-electronics, since the latter are often calibrated to receive plates of standard thickness (for example, 525 µm in the case of silicon plates of diameter 100 mm).

Finally, transport and handling of this type of very thin plate must be limited since the risks of breakage are much greater than with standard plates. To remedy these problems, adhering a fine plate to a support plate allows the fine plate to be rigidified to give it the mechanical properties of a thick plate during the various treatment stages. The plates may be dissociated during or after the process.

All the methods described above may apply both to separation of elements of large dimensions (for example, whole plates measuring several centimetres in diameter) and to the separation of elements of small dimensions (for example, several tens of microns in width).

FIGS. 6 to 12 described below represent in a very schematic way various examples of possible embodiments of the elements of a structure, designed for a separation in accordance with the invention. These elements are, for example, handles as described above. In all these figures, identical references designate identical or similar parts.

It should be specified that the examples illustrated by FIGS. 6 to 12 are not exhaustive and that the various possible ways of forming cavities shown by these figures may be combined with one another.

Reference 100 designates in a general manner the body of the element or handle which, in the illustrated examples, is represented as a circular plate. A face 102 of the element is also defined, which is the adherence face, intended to be brought into adherent contact with another bonded element to form a structure. The two elements of the structure must also be separated subsequently along the plane of adherence face 102.

Figure 6:
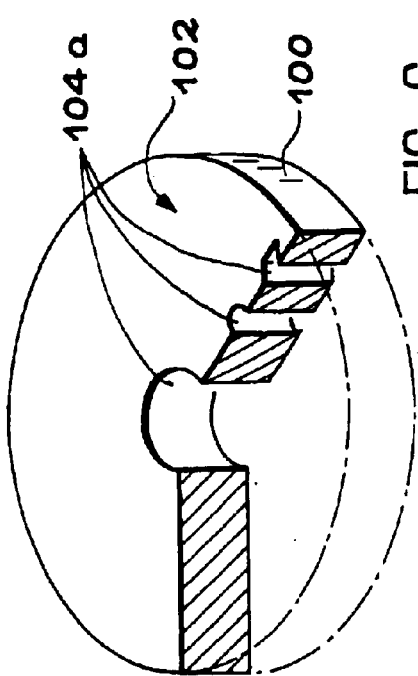

FIG. 6 shows a first example in which cavities 104a appear as holes penetrating element 100 from side to side to link the adherence face to the opposite face. The holes may have different diameters and different shapes. On the adherence face they define an interface zone allowing preferential localised separation. It is also observed that the holes are made in a more or less central region of the element.

Use of an element 200 in accordance with FIG. 6 was illustrated previously in a reference to FIG. 2.

Figure 7:
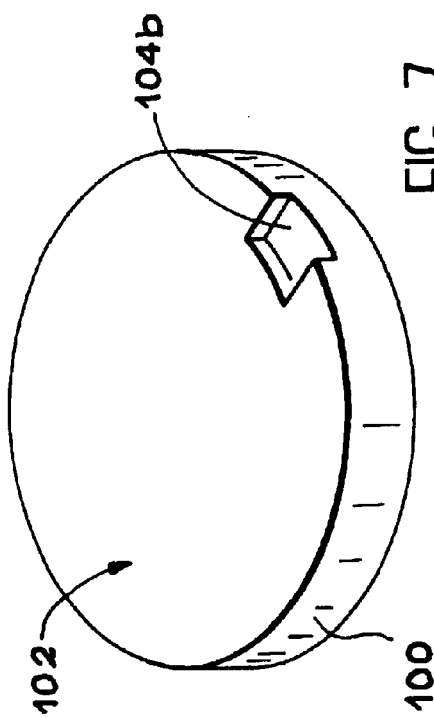

FIG. 7 shows an element 100 with a single cavity 104b, which is non-penetrating, in the form of a recess made in the periphery of the element. Cavity 104b corresponds to recess 16 of plate 2 represented in FIGS. 1A to 1C.

Figure 8:
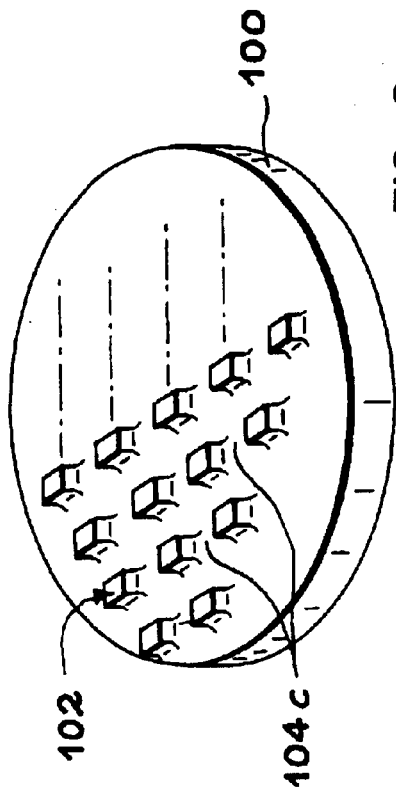
FIGS. 6 to 12 illustrate schematically various possibilities for forming an adherence face of an element of a structure, for use in separation in accordance with the invention.

FIG. 8 shows an element 100 with an adherence face in which broad channels 104c are engraved so as to surround and limit islands 108. The channels 104c allow a pressurised fluid to be applied, but also constitute cavities in the sense of the invention.

Figure 9:
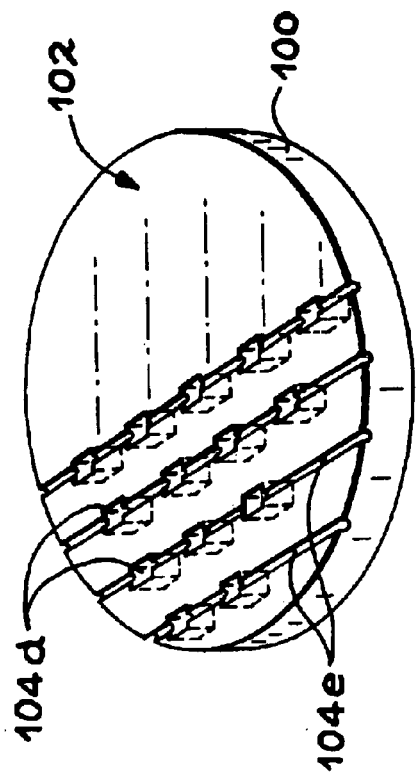

FIG. 9 shows an element 100 with an adherence face 102 in which several non-penetrating cavities 104d are made to form a network of cavities. The cavities are linked together by channels 104e which lead to the periphery of element 100. The channels 104e also constitute means of access to the interface zone containing the cavities 104d.

Figure 10:
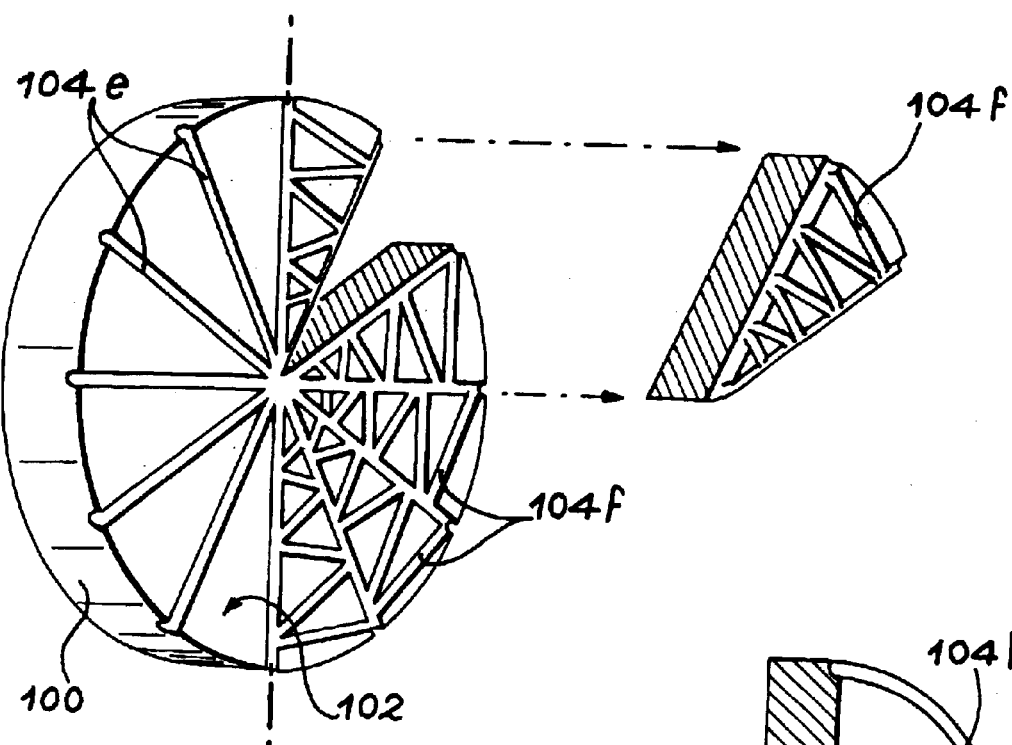

FIG. 10 shows an element 100 the adherence face 102 of which is divided into sectors by channels 104e extending like spokes. The sectors may themselves be crossed by channels 104f in a diagonal intersecting pattern.

Figure 11:
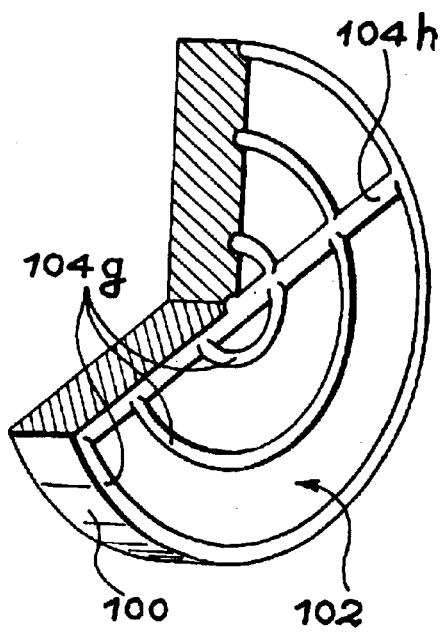

In an alternative embodiment, represented in FIG. 11, channels may also take the form of concentric circular channels 104g, communicating by a radial channel 104h.

Figure 12:
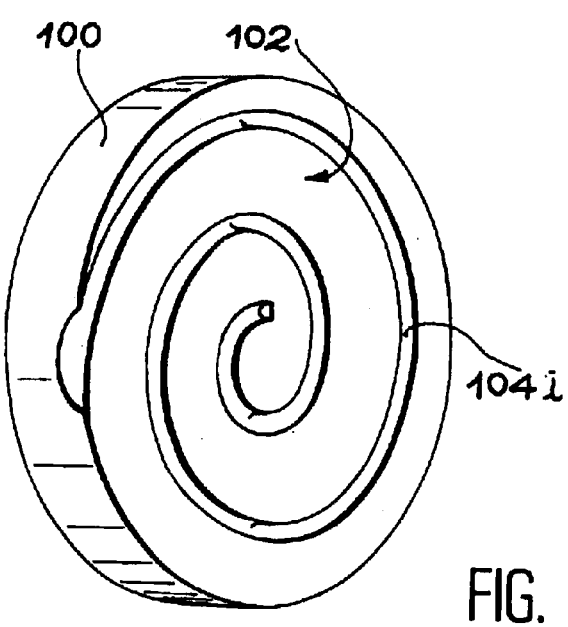

In yet another possibility, represented in FIG. 12, a circular, spiral-shaped channel 104i may extend from the centre to the periphery of the adherence face 102.

Channels 104e, 104f, 104g, 104h and 104i of FIGS. 10 to 12 allow access of a fluid and/or of a separation tool but also constitute cavities in the sense of the invention. They thus define interface zones allowing privileged localised separation.

The interface zone is determined in a general manner by the positioning and/or distribution of the channels on the element's adherence face.

This distribution also allows the element's adherence with a bonded element, and their subsequent separation, to be controlled precisely. A zone with a high density of channels allows easier separation than a zone with a lower density of channels.

As an example, with a spiral-shaped channel, as represented in FIG. 12, the ease of separation depends on the distance between the spires. The separation thus tends to be initiated in the centre of the element and to be propagated in a more or less concentric manner towards the periphery.

This is also the case with the examples of FIGS. 10 and 11.

Figure 13:
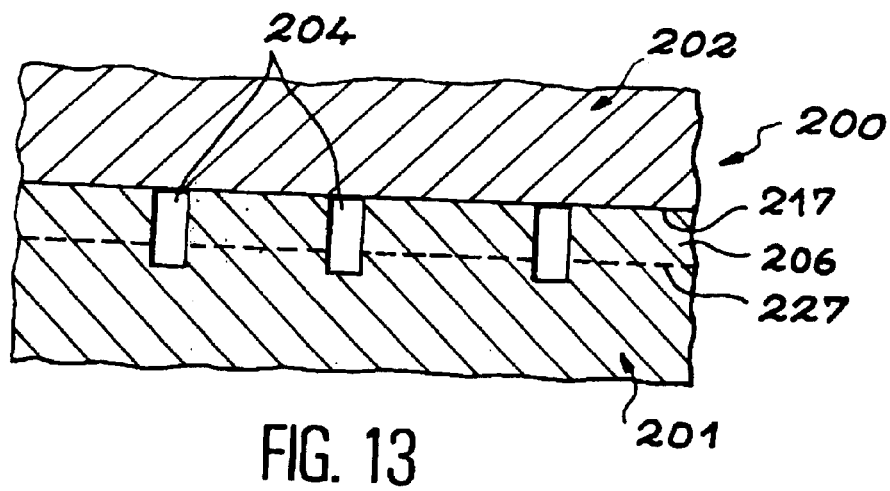
FIG. 13 is a transverse section of a structure formed from two elements and with two interface zones for a separation in accordance with the invention.

FIG. 13 shows a structure 200 formed from a first element 201 and a second element 202.

The two elements are made to form a single piece by their adherence faces, which thus define a first interface 217.

The first element 201 has undergone ion implantation leading to the formation, at a shallow depth, of an embrittled zone forming a second interface 227, in the sense of the invention.

The embrittled zone extends in a manner more or less parallel to the surface of the first element, i.e. in a manner more or less parallel to its adherence face, thus delimiting a thin surface layer 206 in it.

Emerging cavities 204 are engraved in the first element and extend through the thin surface layer 206 before emerging at the second interface 227.

In the example of FIG. 13, the bonding force being exerted between the first and second elements, i.e. between their adherence faces, is higher than the bonding force of the second interface 227. The bonding force of the second interface is understood here as the force which must be overcome to cause separation in the embrittled zone.

When a fluid is applied through the cavities 204, the structure in FIG. 13 will undergo separation, and more specifically separation at the second interface.

Figure 14:
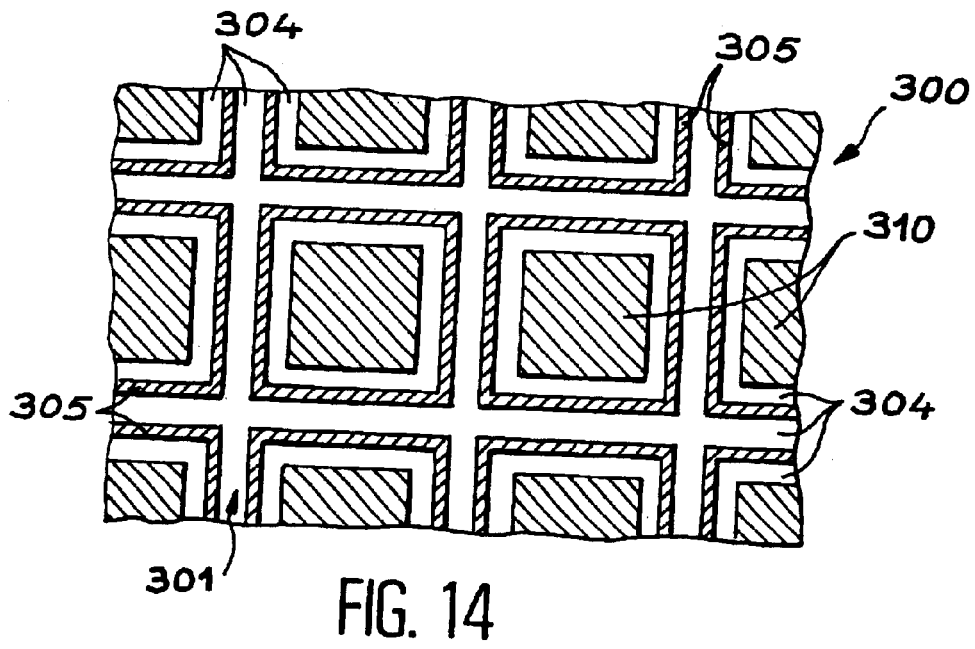
FIG. 14 is a view from above of an adherence face of an element of a specific structure for use in a separation.

FIG. 14 shows an adherence face of an element 301 of a structure 300. The latter is designed for the selective transfer of different parts 310 of this element 300.

The parts identified with reference 310 are surrounded with cavities 304 which are partitioned by walls 305 of the first element.

The cavities enable the different parts 310 to be delimited and extend as far as a buried interface, in the form of an embrittled zone as described above.

Figure 15:
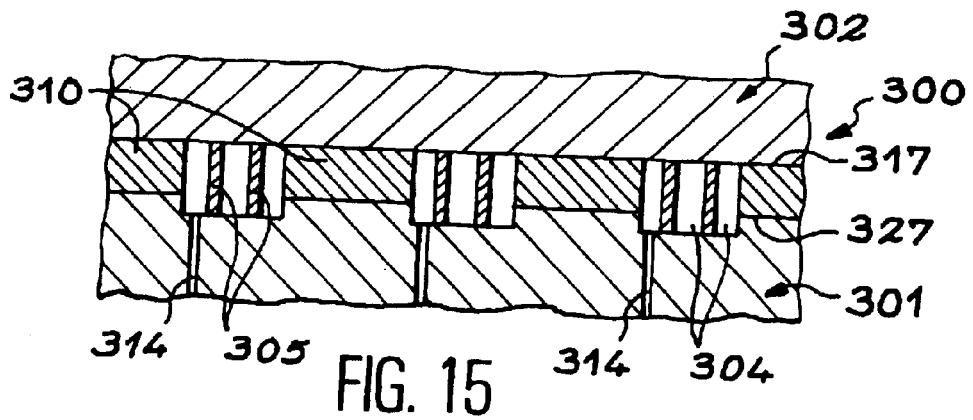
FIG. 15 is a schematic section of a structure including the element of FIG. 14.

FIG. 15 shows in section element 301, which forms a single piece with element 302, to which the parts 310 must be transferred.

It may be observed that fluid accesses 314 enable the cavities 304 of the first element to be supplied selectively, and these cavities surround some of the parts 310. This enables them to be separated in the second interface 327 and to be selectively transferred to the second element 302.

To this end, it should be specified that only some parts 310 may be made a single piece with the second element 302 at the first interface 317.

Once again in this case, the adherence forces at the first interface 317 are greater than those at the second interface 327, i.e. greater than the forces which must be overcome to detach the parts 310 from element 301.

What is claimed is:

1. A process for separating two semi-conductor substrate wafers alone an interface including all points of contact between the wafers, both wafers bonded to one another at adherent faces of the interface, the process comprising:

forming at least one cavity in at least one of the wafers, the cavity providing access of separation means to at least one predetermined zone of the interface;

initiating separation of the wafers along the interface by applying the separation means to the predetermined zone; and continuing separation of the wafers along the interface, by applying the separation means to the predetermined zone and to separated portions of the interface, until a desired degree of separation is achieved, wherein points of entry to the cavity are not located solely at an edge surface of the wafers.

2. The process of claim 1, in which the separation of the two wafers is induced in more than one predetermined zone, in a simultaneous or sequential manner.

3. The process of claim 1, wherein the separation means contains means for exerting a mechanical action at the interface.

4. The process of claim 1, wherein the separation means contains means for exerting a chemical action on at least one of the wafers at the interface.

5. The process of claim 1, wherein the cavity is obtained, in whole or in part, by engraving.

6. The process of claim 1, in which the cavity is made at a periphery of at least one of the wafers and provides access of the separation means to the the adherent faces.

7. The process of claim 1, wherein the cavity is made in an inner region of at least one of the wafers and does not provide access of the separation means to the adherent faces.

8. The process of claim 7, wherein the separation means contains a liquid, the process further comprising using microwaves to excite the liquid of the separation means.

9. The process of claim 1, wherein the cavity penetrates through at least one wafer from side to side.

10. The process of claim 1, wherein several predetermined zones are planned and are arranged so as to initiate the separation at determined locations of the interface.

11. The process of claim 1, wherein the two wafers adhere to one another with a different adherence energy in different regions of the adherent faces, so as to initiate separation at a determined location of the adherent faces.

12. The process of claim 1, for separating two wafers having a first interface formed at the adherent faces and a second interface interface in which the separation of the wafers is induced at one of the first and second interfaces.

13. The process of claim 12, wherein a bonding energy of the second interface is lower than a bonding energy of the first interface, and wherein the separation of the wafers is induced in the second interface.

14. The process of claim 12, in which, before the two wafers are brought into contact, an embrittled zone is formed in at least one of the two wafers at the second interface.

15. The process of claim 14, in which the embrittled zone is formed using an implantation technique or using a layer adherence technique.

16. The process of claim 15, in which the embrittled zone is formed at a shallow depth in one of the wafers such that the second interface delimits a thin layer in the wafer containing the embrittled zone.

17. The process of claim 1, wherein the wafers comprise a first wafer and a second wafer, the first wafer being at most 100 micrometers thick and the second wafer being used as a handle for the first wafer.

18. The process of claim 1, wherein the cavity is formed in the second wafer.

19. The process of claim 1, wherein the cavity is formed before the wafers are bonded to one another.

20. A device for separating two semi-conductor substrate wafers along an interface including all points of contact between the wafers, both wafers bonded to one another at adherent faces of the interface, at least one wafer including a cavity extending to at least one of the adherent faces, points of entry to the cavity not being located solely at an edge surface of the wafers, the device comprising:
   fluid or gas for subjecting the at least one of the adherent faces to at least one of a chemical or mechanical action;
   an enclosure with at least one high-pressure chamber configured to receive the fluid or gas; and
   at least one low-pressure chamber,
   wherein the enclosure is formed so as to receive the two wafers such that the cavity communicates with the high-pressure chamber.

21. The device of claim 20, wherein the holding means comprises at least one joint arranged between one of the wafers and a wall of the enclosure.

22. The device of claim 21, in which at least one joint is arranged between a main face of at least one of the wafers in a form of a plate and a wall of the enclosure facing the main face.

23. The device of claim 21, in which at least one joint is arranged between an edge of at least one of the wafers in a form of a plate and a wall of the enclosure facing the edge.

24. The device of claim 20, wherein the wafers comprise a first wafer and a second wafer, the first wafer being at most 100 micrometers thick and the second wafer being used as a handle for the first wafer.

25. The device of claim 20, wherein the cavity is formed in the second wafer.

26. The device of claim 20, wherein the cavity is formed before the wafers are bonded to one another.

27. A process for separation of first and second wafers, the two wafers bonded by adherent faces of an interface including all points of contact between the first and second wafers, the second wafer including at least one cavity formed in an interface portion of the second wafer so as to extend onto the interface and to face an interface portion of the first wafer, the process comprising:
   inserting separation means into the cavity, the separation means comprising a liquid or a gas and inducing a higher pressure within the cavity;
   inducing a lower pressure within a chamber bounded, in part, by at least one of the two wafers; and
   preventing excessive deformation of at least one of the two wafers, by providing a stopper within the chamber having the lower pressure.

28. The process of claim 27, in which the separation of the two wafers is induced in one or more of the interface portions, in a simultaneous or sequential manner.

29. The process of claim 27, wherein the separation means further comprises means for exerting a mechanical action at the interface.

30. The process of claim 27, wherein the separation means further comprises means for exerting a chemical action on at least one of the wafers at the interface.

31. The process of claim 27, wherein the cavity is obtained, in whole or in part, by engraving.

32. The process of claim 27, in which the cavity is made at a periphery of at least one of the wafers and permits access of the separation means to the adherent faces.

33. The process of claim 27, wherein the cavity is made in an inner region of at least one of the wafers and does not permit access of the separation means to the adherent faces.

34. The process of claim 33, wherein the separation means contains a liquid, the process further comprising using microwaves to excite the liquid of the separation means.

35. The process of claim 27, wherein the cavity penetrates through at least one wafer from side to side.

36. The process of claim 27, wherein several cavities are planned and are arranged so as to initiate the separation at determined locations of the interface.

37. The process of claim 27, wherein the two wafers adhere to one another with a different adherence energy in different regions of the adherent faces, so as to initiate separation at a determined location of the adherent faces.

38. The process of claim 27, for separating two wafers having at least a first interface portion formed at the adherent faces and at least one second interface portion, in which the separation of the wafers is induced at one of the first and second interface portions.

39. The process of claim 38, wherein a bonding energy in the second interface portion is lower than a bonding energy of the first interface portion, and wherein the separation of the wafers is induced in the second interface portion.

40. The process of claim 38, in which, before the two wafers are brought into contact, an embrittled zone is formed in at least one of the two wafers at the second interface portion.

41. The process of claim 40, in which the embrittled zone is formed using an implantation technique or using a layer adherence technique.

42. The process of claim 41, in which the embrittled zone is formed at a shallow depth in one of the wafers such that the second interface portion delimits a thin layer in the wafer containing the embrittled zone.

* * * * *